United States Patent
Kim et al.

(10) Patent No.: US 10,079,365 B2
(45) Date of Patent: Sep. 18, 2018

(54) ORGANIC LIGHT EMITTING DIODE DISPLAY DEVICE

(71) Applicant: LG DISPLAY CO., LTD., Seoul (KR)

(72) Inventors: Sookang Kim, Paju-si (KR); Soyoung Jo, Seoul (KR); Wonhoe Koo, Goyang-si (KR); Jihyang Jang, Goyang-si (KR); Hyunsoo Lim, Goyang-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/252,030

(22) Filed: Aug. 30, 2016

(65) Prior Publication Data

US 2017/0062769 A1 Mar. 2, 2017

(30) Foreign Application Priority Data

Aug. 31, 2015 (KR) .................... 10-2015-0123159

(51) Int. Cl.
*H01L 51/52* (2006.01)
*H01L 27/32* (2006.01)

(52) U.S. Cl.
CPC ........ *H01L 51/5275* (2013.01); *H01L 27/326* (2013.01); *H01L 27/3246* (2013.01); *H01L 27/3248* (2013.01); *H01L 27/3258* (2013.01); *H01L 51/5203* (2013.01)

(58) Field of Classification Search
CPC ............. H01L 27/3246; H01L 27/3248; H01L 27/3258; H01L 27/326; H01L 51/5203; H01L 51/5275
See application file for complete search history.

(56) References Cited

U.S. PATENT DOCUMENTS

| 2006/0176421 A1* | 8/2006 | Utsumi ............. G02F 1/133611 349/69 |
| 2014/0306213 A1* | 10/2014 | Sato .................... H01L 51/5275 257/40 |
| 2015/0048333 A1 | 2/2015 | Choi et al. |
| 2015/0060840 A1* | 3/2015 | Nishimura .......... H01L 51/5275 257/40 |
| 2015/0171370 A1 | 6/2015 | Ehrensperger et al. |

(Continued)

FOREIGN PATENT DOCUMENTS

| JP | P2006164808 A | 6/2009 |
| JP | 2010-176928 A | 8/2010 |

(Continued)

*Primary Examiner* — Allan R Wilson
(74) *Attorney, Agent, or Firm* — Dentons US LLP

(57) ABSTRACT

An organic light emitting diode display device is provided. The organic light emitting diode display device includes a first insulating layer disposed on a substrate and having a first refractive index, a refraction inducing layer disposed on the first insulating layer having a second refractive index, a second insulating layer disposed on the refraction inducing layer and having a third refractive index, a first electrode disposed on the second insulating layer and having a fourth refractive index, and an organic light emitting layer and a second electrode disposed on the first electrode. The second insulating layer, the first electrode, the organic light emitting layer, and the second electrode include a plurality of convex parts and a plurality of concave parts.

21 Claims, 9 Drawing Sheets

(56) References Cited

U.S. PATENT DOCUMENTS

| | | | | |
|---|---|---|---|---|
| 2015/0236300 A1* | 8/2015 | Naraoka | ............. | H01L 51/5262 257/40 |
| 2015/0362635 A1* | 12/2015 | Toriyama | ............. | G02B 5/0268 438/29 |
| 2016/0072101 A1* | 3/2016 | Choi | ................... | H01L 51/0097 257/40 |
| 2016/0141528 A1* | 5/2016 | Masuyama | .......... | G02B 5/1814 257/40 |
| 2016/0285032 A1* | 9/2016 | Popp | ................... | H01L 51/5221 |
| 2017/0133638 A1* | 5/2017 | Takahashi | ............ | H01L 51/5275 |
| 2017/0279081 A1* | 9/2017 | Yamazaki | ........... | H01L 51/5246 |

FOREIGN PATENT DOCUMENTS

| | | |
|---|---|---|
| KR | 1020130016937 A | 2/2013 |
| KR | 1020140141679 A | 12/2014 |
| TW | I275320 | 3/2007 |
| TW | 201407848 A | 2/2014 |

\* cited by examiner

ORGANIC LIGHT EMITTING DIODE DISPLAY DEVICE

CROSS-REFERENCE TO RELATED APPLICATIONS

This application claims priority from Korean Patent Application No. 10-2015-0123159 filed on Aug. 31, 2015, which is hereby incorporated by reference for all purposes as if fully set forth herein.

BACKGROUND OF THE INVENTION

Field of the Invention

The present invention relates to an organic light emitting diode display device and more particularly to an organic light emitting diode display device having enhanced light extraction efficiency.

Description of the Related Art

An organic light emitting diode display device is a self-light emitting display device and, unlike a liquid crystal display, a separate light source is not required. Thus, the organic light emitting diode display device can be manufactured in a lightweight and thin form. Further, an advantage of the organic light emitting diode display device is that it is driven with a low voltage, which leads to lower power consumption. Also, the organic light emitting diode display device has excellent color expression ability, a high response speed, a wide viewing angle, and a high contrast ratio (CR). Therefore, the organic light emitting diode display device has been identified as a next-generation display device.

Light emitted from an organic light emitting layer of the organic light emitting diode display device passes through several components of the organic light emitting diode display device before being extracted to the outside of the organic light emitting diode display device. However, some light emitted from the organic light emitting layer is not extracted to the outside of the organic light emitting diode display device, but is, instead, locked in the organic light emitting diode display device. Therefore, the light extraction efficiency of the organic light emitting diode display device decreases.

Specifically, in a bottom emission type organic light emitting diode display device, approximately 50% of light emitted from the organic light emitting layer is locked in the organic light emitting diode display device due to total reflection or absorption by an anode electrode. Further, approximately 30% of light emitted from the organic light emitting layer is locked in the organic light emitting diode display device due to total reflection or absorption by a substrate. Thus, approximately 80% of the light emitted from the organic light emitting layer is locked in the organic light emitting diode display device and only 20% of the light is extracted to the outside. Therefore, the light extraction efficiency is very low.

In order to improve the light extraction efficiency of the organic light emitting diode display device, a micro lens array (MLA) on an overcoat layer of the organic light emitting diode display device, or a low index grid (LIG) structure, in which a plurality of low refractive index patterns spaced apart from each other are disposed on an anode electrode of the organic light emitting diode, may be formed.

However, even when a micro lens array is formed on the overcoat layer of the organic light emitting diode display device, a large quantity of light is locked in the diode, and the quantity of light extracted to the outside is small.

Further, when a plurality of patterns, which are spaced apart from each other, are disposed on the anode electrode of the organic light emitting diode, a non-emission area is generated and blurring and/or ghost phenomena are observed. Therefore, there is a demand for an organic light emitting diode display device which can solve the above-mentioned problems.

SUMMARY OF THE INVENTION

The present invention has been made in an effort to provide an organic light emitting diode display device with enhanced light extraction efficiency and in which the generation of non-emission areas is suppressed.

According to an aspect of the present invention, an organic light emitting diode display device is provided. The organic light emitting diode display device has an emission area and a non-emission area, and includes a first insulating layer disposed on a substrate and having a first refractive index, a refraction inducing layer disposed on the first insulating layer and having a second refractive index, a second insulating layer disposed on the refraction inducing layer and having a third refractive index, a first electrode disposed on the second insulating layer and having a fourth refractive index, and an organic light emitting layer and a second electrode disposed on the first electrode. The second insulating layer, the first electrode, the organic light emitting layer, and the second electrode include a plurality of convex parts and a plurality of concave parts.

The refractive indexes of the first insulating layer and the second insulating layer may be equal to each other, and the refractive indexes of the refraction inducing layer and the first electrode may be equal to each other. Further, the refractive indexes of the first insulating layer and the second insulating layer may be lower than the refractive indexes of the refraction inducing layer and the first electrode. The refractive index of the refraction inducing layer and the first electrode may be 1.7 to 2.0.

When light is incident on the second insulating layer at an angle larger than a critical angle for total reflection, the light may be incident onto the second insulating layer more than once via the refraction inducing layer.

According to an exemplary embodiment of the present invention, the number of times light generated from an organic light emitting diode is incident on the micro lens formed on a second insulating layer increases, which improves the light extraction efficiency.

Further, according to another exemplary embodiment of the present invention, the amount of light having an incident angle larger than a critical angle for total reflection at an interface of the first electrode and the second insulating layer of the organic light emitting diode, and which is locked in the diode, is reduced. Thus, the light extraction efficiency and life span of the organic light emitting diode increases.

Further, according to another exemplary embodiment of the present invention, a low reflective index pattern which is disposed on the first electrode of the organic light emitting diode, is removed, thereby suppressing the generation of non-emission areas.

According to an exemplary embodiment of the present invention, in a plurality of sub pixels, a maximum width of a concave part or a convex part of a micro lens disposed in a sub pixel having lower emission efficiency is smaller than the maximum width of a concave part or a convex part of a micro lens disposed in a sub pixel having higher emission efficiency.

According to an exemplary embodiment of the present invention, the plurality of micro lenses are disposed to expose a part of the refraction inducing layer.

According to an exemplary embodiment of the present invention, the refraction inducing layer is disposed on an emission area.

According to an exemplary embodiment of the present invention, a bank pattern is disposed on the first insulating layer.

According to another exemplary embodiment of the present invention, an organic light emitting diode display device is provided. The organic light emitting diode display device includes: a substrate including a plurality of sub pixels; a first insulating layer disposed on the substrate; a refraction inducing layer disposed on the first insulating layer; a second insulating layer disposed on the refraction inducing layer; and a first electrode, an organic light emitting layer, and a second electrode forming an organic light emitting diode disposed on the second insulating layer, and the organic light emitting diode includes a plurality of concave parts and a plurality of convex parts, wherein a refractive index of the first insulating layer is equal to a refractive index of the second insulating layer, and a refractive index of the refraction inducing layer is equal to a refractive index of the first electrode.

According to an exemplary embodiment of the present invention, the refractive index of the refraction inducing layer and the first electrode is higher than the refractive index of the first insulating layer and the second insulating layer.

BRIEF DESCRIPTION OF THE DRAWINGS

The above, and other, aspects, features and advantages of the present invention will be more clearly understood from the following detailed description taken in conjunction with the accompanying drawings, in which.

DETAILED DESCRIPTION OF THE EMBODIMENT

Figure 1:
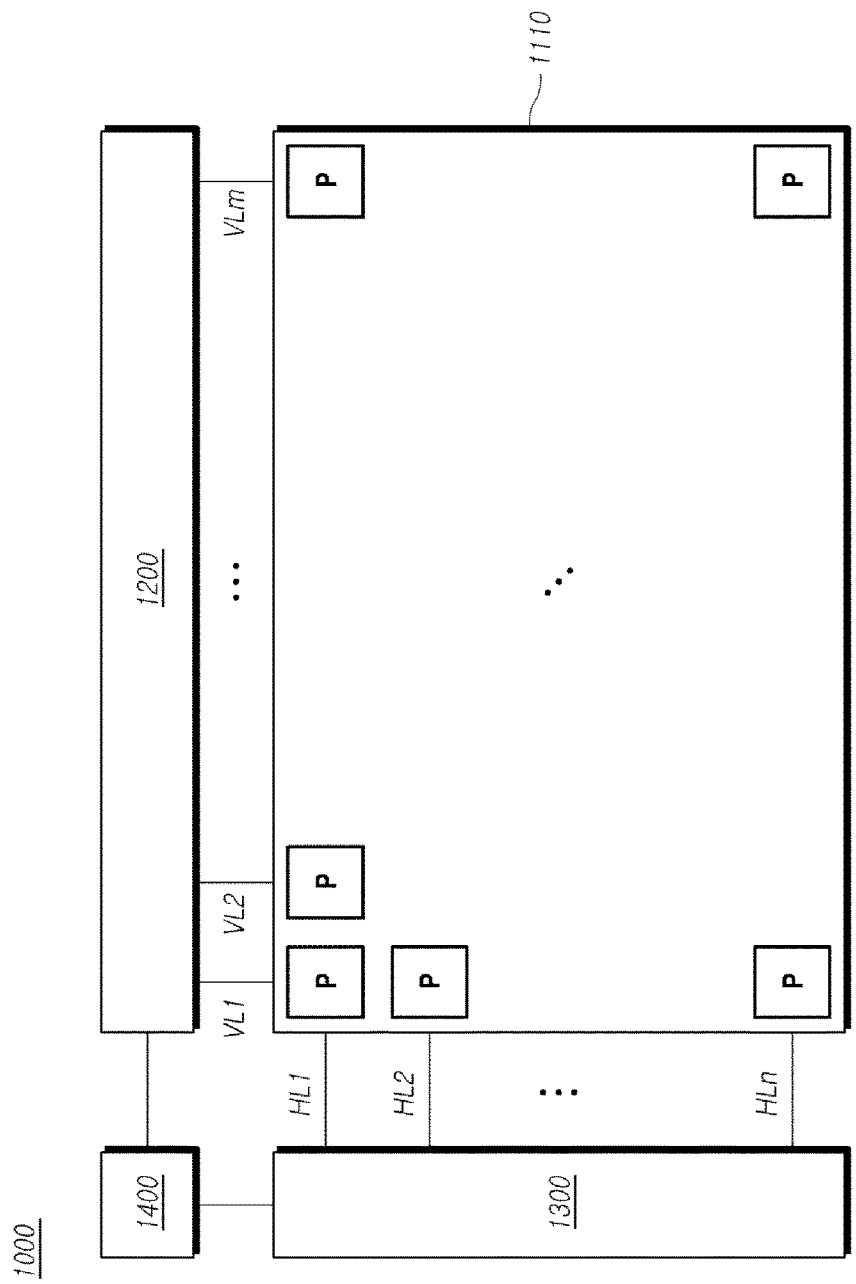
FIG. 1 is a schematic view illustrating a display device according to an exemplary embodiment.

Hereinafter, exemplary embodiments to the present disclosure will be described in detail with reference of the accompanying drawings. The following exemplary embodiments are provided for sufficiently conveying the concept of the present disclosure to those skilled in the art. Therefore, the present disclosure is not limited to the following exemplary embodiments themselves but can be modified and changed into other embodiments. In the drawings, a size and a thickness of the device may be exaggerated for the sake of convenience. Like reference numerals principally refer to like elements throughout the specification.

Advantages and characteristics of the present invention and a method of achieving the advantages and characteristics will be clear by referring to the exemplary embodiments described below in detail together with the accompanying drawings. However, the present disclosure is not limited to the following exemplary embodiments but may be implemented in various different forms. The exemplary embodiments are provided only to complete disclosure of the present application and to fully provide a person having ordinary skill in the art to which the present disclosure pertains with the category of the invention described therein, and the present disclosure will be defined by the appended claims.

When an element or layer is disposed "on" another element or layer, an intervening layer or element may be interposed directly on the other element or therebetween. In contrast, when an element is referred to as being "immediately on" or "directly on" another element, no intervening elements or layers may be present.

Spatially-relative terms such as "below", "beneath", "lower", "above", and "upper" may be used herein for ease of description to describe the relationship of one element(s) or component(s) with another element(s) or component(s) as illustrated in the drawings. The spatially relative term should be understood to include different directions of an element which is used or operated, in addition to the direction illustrated in the drawing(s). For example, if the element in the drawings is turned over, elements described as "below" or "beneath" other elements would then be oriented "above" the other elements. Therefore, an exemplary term "below" may encompass both an orientation of above and below.

Further, in describing components of the present invention, terminologies such as first, second, A, B, (a) and (b) may be used. These terms are used to distinguish one component from another, similar, component but the nature, order or number of the components are not limited by this terminology.

FIG. 1 is a schematic view illustrating a display device according to an exemplary embodiment.

Referring to FIG. 1, a display device 1000 includes a display panel 1100, a first driver 1200, a second driver 1300, and a timing controller 1400. In the display panel 1100, a plurality of first lines VL1 to VLm are formed in a first vertical direction, and a plurality of second lines HL1 to HLn are formed in a second horizontal direction. The first driver 1200 supplies a first signal to the plurality of first lines VL1 to VLm and the second driver 1300 supplies a second signal to the plurality of second lines HL1 to HLn. The timing controller 1400 controls the first driver 1200 and the second driver 1300.

In the display panel 1100, the plurality of first lines VL1 to VLm formed in the first direction and the plurality of second lines HL1 to HLn formed in the second direction intersect to define a plurality of pixels P.

Each of the first driver 1200 and the second driver 1300 described above may include at least one driver integrated circuit (driver IC) which outputs a signal for displaying an image.

The plurality of first lines VL1 to VLm formed in the first direction in the display panel 110 may be data lines which are formed in a vertical direction to transmit data voltages (first signals) to pixel columns in the vertical direction. The first driver 1200 may be a data driver which supplies data voltages to the data lines.

Further, the plurality of second lines HL1 to HLn formed in the second direction in the display panel 1100 may be gate lines which are formed in a horizontal direction to transmit scan signals (first signals) to pixel columns in the horizontal direction. The second driver 1300 may be a gate driver which supplies scan signals to the gate lines.

Further, a pad unit is configured in the display panel 1100 to connect the first driver 1200 and the second driver 1300. When the first driver 1200 supplies the first signal to the plurality of first lines VL1 to VLm, the pad unit transmits the first signal to the display panel 1100. Similarly, when the second driver 1300 supplies the second signal to the plurality of second lines HL1 to HLn, the pad unit transmits the second signal to the display panel 1100.

Each pixel includes one or more sub pixels. The sub pixel refers to a unit in which one specific kind of color filter is formed, or in which an organic light emitting diode emits light having a specific color without forming a color filter. Even though colors defined in the sub-pixel may include red R, green G, and blue B, and selectively include white W, the present invention is not limited thereto. Each sub pixel includes a separate thin film transistor and an electrode connected to the thin film transistor. Therefore, a sub pixel is also referred to as one pixel area. Every sub pixel may have an individual first line or a plurality of sub pixels may share a specific first line. Configurations of pixel/sub pixel and a first line/second line may be modified in various forms, but the present invention is not limited thereto.

An electrode which is connected to a thin film transistor configured to control emission of each pixel area of the display panel 1100 is referred to as a first electrode. An electrode which is disposed on an entire surface of the display panel or is disposed to include two or more pixels is referred to as a second electrode. When the first electrode is an anode electrode, the second electrode is a cathode electrode. In contrast, when the first electrode is a cathode electrode, the second electrode is an anode electrode. Hereinafter, the anode electrode is mainly described as an exemplary embodiment of the first electrode and the cathode electrode is mainly described as an exemplary embodiment of the second electrode, but the present disclosure is not limited thereto.

Further, the organic light emitting diode display device may be classified as a top emission type or a bottom emission type in accordance with a structure of the organic light emitting diode. In the following exemplary embodiments, a bottom emission type organic light emitting diode display device will be mainly described, but the present invention is not limited thereto.

Further, a color filter having a single color may or may not be disposed in the above-described sub-pixel. The color filter may convert a single color of the organic light emitting layer into a color having a specific wavelength. Further, a light scattering layer may be disposed in each sub-pixel to increase light extraction efficiency of the organic light emitting layer. The above-mentioned light scattering layer may be a micro lens array, a nano pattern, a diffuse pattern, or a silica bead.

Hereinafter, as exemplary embodiments of the light scattering layer, a micro lens array will be mainly described. However, the exemplary embodiments of the present invention are not limited thereto, but various structures which scatter light may be coupled thereto.

Figure 2:
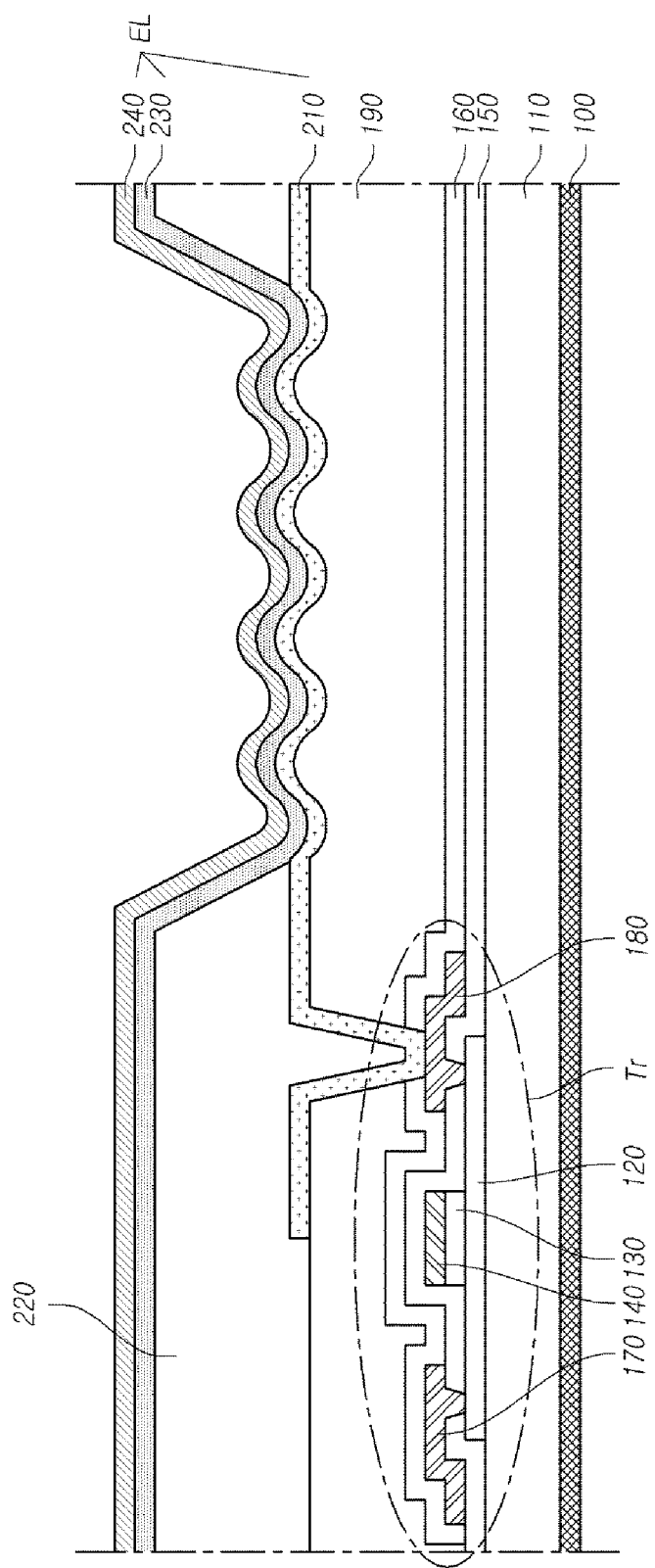
FIG. 2 is a cross-sectional view of an exemplary embodiment of a bottom emission type organic light emitting diode display device.

FIG. 2 is a cross-sectional view of a bottom emission type organic light emitting diode display device which is an exemplary embodiment of the present invention. Referring to FIG. 2, the bottom emission type organic light emitting diode display device includes a thin film transistor Tr and an organic light emitting diode EL which is electrically connected to the thin film transistor Tr.

Specifically, an active layer 120 of the thin film transistor Tr is disposed on the substrate 110. A gate insulating layer 130 and a gate electrode 140 are disposed on the active layer 120. An insulating interlayer 150 is disposed on the gate electrode 140.

Further, a source electrode 170 and a drain electrode 180 which are in contact with the active layer 120 through a contact hole formed in the insulating interlayer 150 are disposed on the insulating interlayer 150. A passivation layer 160 is formed on the source electrode 170 and the drain electrode 180. The bottom emission type organic light emitting diode display device is not limited to that of FIG. 2 and the bottom emission type organic light emitting diode display device may further include a buffer layer disposed between the substrate 110 and the active layer 120.

Further, an overcoat layer 190 is disposed on the substrate 110 and the passivation layer 160. A first electrode 210 of the organic light emitting diode EL is connected to the drain electrode 180 of the thin film transistor Tr and is disposed on the overcoat layer 190. Further, a bank pattern 220 is disposed on the overcoat layer 190 to expose a part of a top surface of the first electrode 210. An organic light emitting layer 230 is disposed on the top surface of the first electrode 210 which is exposed by the bank pattern 220. A second electrode 240 of the organic light emitting diode is disposed on the organic light emitting layer 230.

In this case, the first electrode 210 may be formed of a transparent conductive material and the second electrode 240 may be formed of an opaque conductive material. Further, the second electrode 240 may be formed of an opaque conductive material and may have excellent reflexibility.

Further, a polarizer 100 is disposed on a rear surface of the substrate 110. The polarizer 100 may have a polarizing axis in a predetermined direction and pass only light having the same direction axis as the polarizing axis, of light which is incident from a rear surface of the substrate 110. Further, in FIG. 2, even though the polarizer 100 having a single layer is disclosed, the exemplary embodiments of the present invention is not limited thereto and the polarizer 100 may be multi-layer polarizer.

Further, even though not illustrated in FIG. 2, the bottom emission type organic light emitting diode display device may further include a color filter layer disposed on the passivation layer 160. However, the color filter layer may be disposed in only some of the plurality of sub pixels.

In order to improve the light extraction efficiency in the bottom emission type organic light emitting diode display device as described above, a plurality of low refractive index patterns may be disposed on the first electrode 210 of the organic light emitting diode EL such that the patterns are spaced apart from each other. However, current does not flow in a region where the low refractive index pattern is disposed, which generates a non-emission area, thereby reducing light emission. Here, the low refractive index pattern may be formed of a material having a refractive index which is lower than a refractive index of the first electrode 210.

Further, in order to improve the light extraction efficiency of the bottom emission type organic light emitting diode display device as described above, an overcoat layer may be introduced, which includes a micro lens array having a plurality of concave parts and a plurality of convex parts. However, a problem associated with such a device is the variance in light extraction efficiency in different regions of the micro lens array.

Exemplary embodiments of the present invention, which will be described below, are provided to solve the above-described problems. Such exemplary embodiments of the present invention provide an organic light emitting diode display device including a first insulating layer having a first refractive index, a refraction inducing layer having a second refractive index, a second insulating layer having a third refractive index, and a first electrode having a fourth refractive index, and a current, which is smoothly carried in the organic light emitting diode, to improve the emission efficiency.

Figure 3:
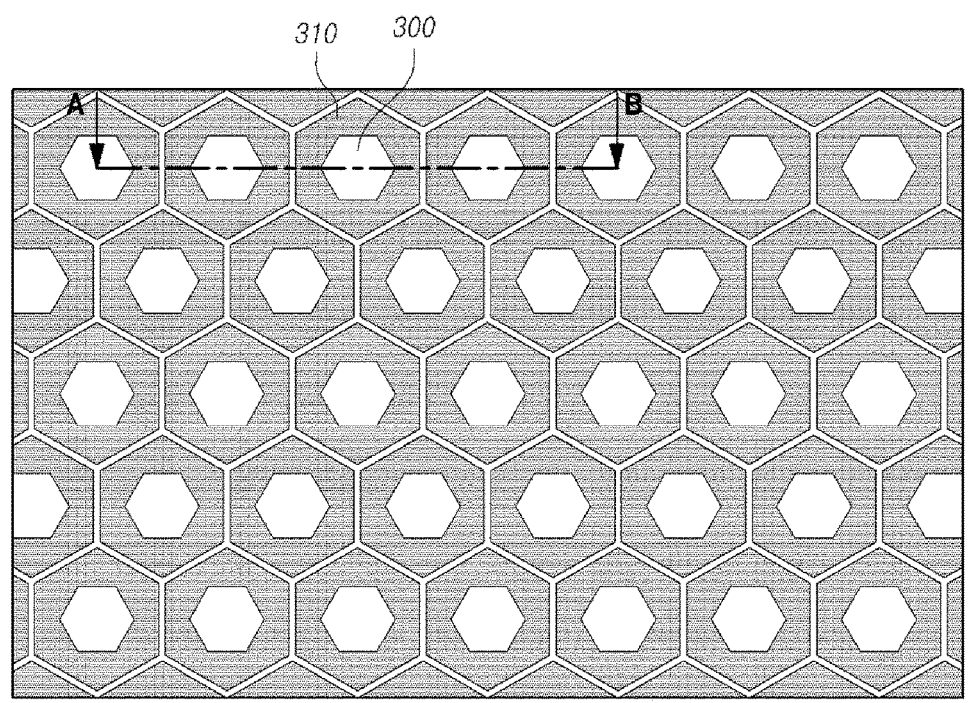
FIG. 3 is a plan view illustrating a region of the organic light emitting diode display device according to an exemplary embodiment of the present invention in which a micro lens is disposed.

The above-described configuration will be described with reference to descriptions of the exemplary embodiments which will be described below. FIG. 3 is a plan view illustrating a region of the organic light emitting diode display device according to an exemplary embodiment of the present invention in which a micro lens is disposed.

Referring to FIG. 3, in the organic light emitting diode display device according to the exemplary embodiment of the present invention, the region where the micro lens is disposed is an emission area of the organic light emitting diode display device. The region may be divided into a first region 300 and a second region 310, which is a remaining region excluding the first region 300.

The first region 300 may be a region corresponding to a side of the concave part or the convex part of the micro lens, and the second region 310 may be a remaining region excluding the region corresponding to the side of the concave part or the convex part of the micro lens.

As shown in FIG. 3, a region where the micro lens is disposed has a hexagonal shape in a plane view, but the exemplary embodiment of the present invention is not limited thereto. The micro lens may have various shapes such as a hemispheric shape, a semi-elliptical shape, or a quadrangular shape.

Figure 4:
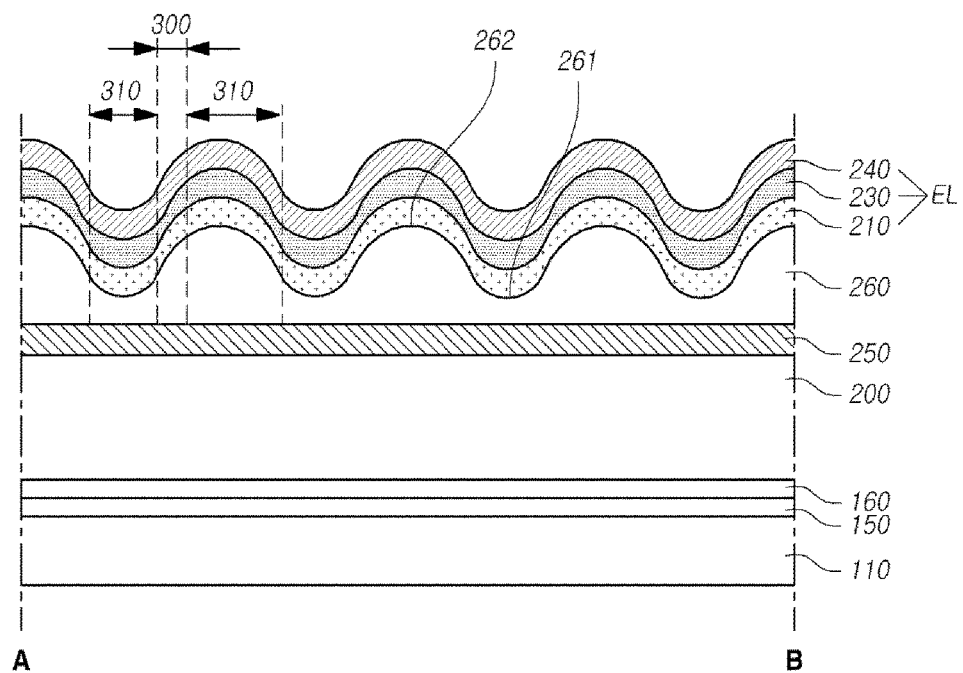
FIG. 4 is a cross-sectional view along the line A-B of a region of a display device according to an exemplary embodiment of the present invention in which a micro lens is disposed.

FIG. 4 is a cross-sectional view of a region of a display device according to an exemplary embodiment of the present invention in which a micro lens is disposed, taken along the line A-B.

In FIG. 4, an interlayer insulating layer 150 and a passivation layer 160 may be disposed on a substrate 110. A first insulating layer 200 is formed on the passivation layer 160. In this case, the first insulating layer 200 has a first refractive index.

A refraction inducing layer 250 having a second refractive index is disposed on the first insulating layer 200. A second insulating layer 260 having a third refractive index is disposed on the refraction inducing layer 250. In this case, the second insulating layer 260 may include a micro lens array having a plurality of concave parts 261 and a plurality of convex parts 262.

A first electrode 210 of an organic light emitting diode EL, having a fourth refractive index, disposed on the second insulating layer 260 such that the organic light emitting diode EL follows the morphology of the second insulating layer 260. Further, an organic light emitting layer 230 and a second electrode 240 are sequentially disposed such that the organic light emitting layer 230 and the second electrode 240 follow the morphology of the first electrode 210. By doing this, the first electrode 210, the organic light emitting layer 230, and the second electrode 240 also include the plurality of concave parts and the plurality of convex parts, in a manner similar to the second insulating layer 260.

The refractive index of the first insulating layer 200 and the refractive index of the second insulating layer 260 may be equal to each other. That is, the first refractive index and the third refractive index may be equal to each other. To this end, the first insulating layer 200 and the second insulating layer 260 may be formed of the same material. For example, the first insulating layer 200 and the second insulating layer 260 may be formed using a transparent resin such as an acrylic-based epoxy having an insulating property. When the first insulating layer 200 and the second insulating layer 260 are formed of the same material, as described above, the manufacturing process may be simplified.

The refractive index of the refraction inducing layer 250 and the refractive index of the first electrode 210 of the organic light emitting diode EL may be equal to each other. That is, the second refractive index and the fourth refractive index may be equal to each other. To this end, the refraction inducing layer 250 and the first electrode 210 may be formed of the same material. For example, the refraction inducing layer 250 and the first electrode 210 may be formed of indium tin oxide (ITO) or indium zinc oxide (IZO).

The material of the refraction inducing layer 250 is not limited thereto, but may be formed of a material different from the material of the first electrode. For example, the refraction inducing layer 250 may be formed of silicon nitride (SiNx) and the first electrode 210 may be formed of indium tin oxide (ITO).

The refractive index of the first insulating layer 200 and the refractive index of the second insulating layer 260 may be lower than the refractive index of the refraction inducing layer 250 and the refractive index of the first electrode 210.

The display device according to this exemplary embodiment may further include a color filter layer (not illustrated) disposed below the second insulating layer 260. The micro lens provided in the second insulating layer 260 according to the exemplary embodiment may be disposed so as not to expose the color filter layer (not illustrated) disposed below the second insulating layer 260. If the micro lens is disposed to expose the color filter layer (not illustrated), reliability of the organic light emitting display device may be affected. The micro lens of the display device according to the present exemplary embodiment is provided so as not to expose the color filter layer (not illustrated) disposed below the second insulating layer 260, thereby reducing the influence of the color filter layer (not illustrated) on reliability. For example, outgassing by the color filter layer may be prevented.

Further, the refractive index of the refraction inducing layer 250 and the refractive index of the first electrode 210 may be 1.7 to 2.0. That is, the refraction inducing layer 250 and the first electrode 210 may be formed of a material having a refractive index of 1.7 to 2.0.

The refractive index of the second insulating layer 260 is lower than the refractive index of the first electrode 210 and the refractive index of the refraction inducing layer 250 is higher than the refractive index of the second insulating layer 260. Further, the refractive index of the first insulating layer 200 is lower than the refractive index of the refraction inducing layer 250. As a result, light generated in the organic light emitting diode EL is refracted by the refraction inducing layer 250 so as to be extracted to the outside of the substrate 110 through the second insulating layer 260.

Specifically, the second insulating layer 260 which is disposed below the first electrode 210 has a refractive index which is lower than that of the first electrode 210. Therefore, light traveling with an incident angle larger than a critical angle for total reflection may be totally reflected at an interface of the first electrode 210 and the second insulating layer 260.

Further, since the refractive index of the second insulating layer 260 is lower than the refractive index of the refraction inducing layer 250, a part of light which is totally reflected at the interface of the first electrode 210 and the second insulating layer 260 is refracted at an interface of the second insulating layer 260 and the refraction inducing layer 250 to be directed toward the second insulating layer 260.

The path of the light which is incident on the second insulating layer 260 is changed by the convex part 262 of the second insulating layer 260 so that the light is emitted toward the substrate 110. Thus, the light extraction efficiency of the organic light emitting diode display device according to the exemplary embodiment of the present invention may improve. Further, the non-emission area may not be generated because the plurality of patterns for improving the light extraction efficiency is not used on the first electrode.

Figure 5:
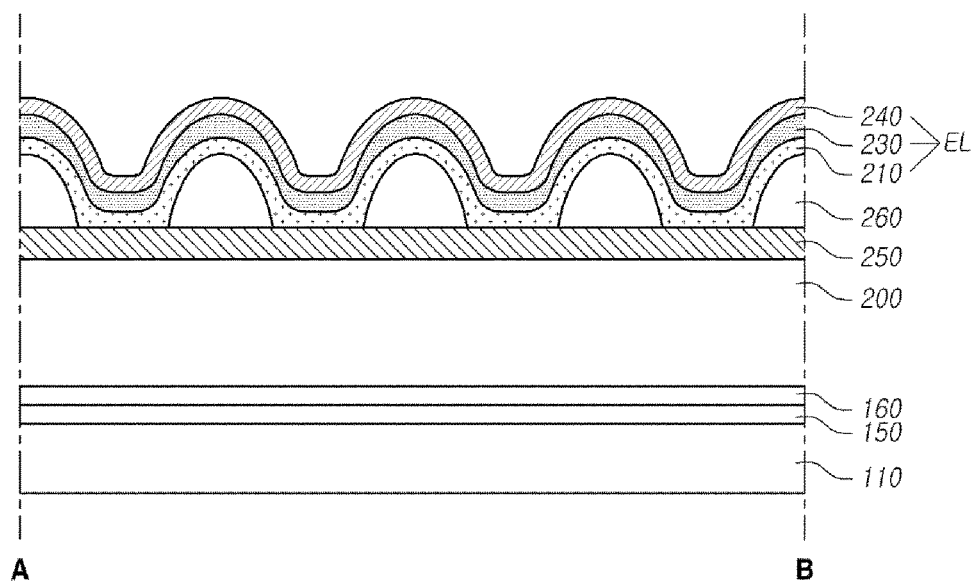
FIG. 5 is a schematic view illustrating a micro lens shape according to another exemplary embodiment of the present invention and an organic light emitting diode display device including the same.

The shape of the micro lens according to the exemplary embodiment of the present invention is not limited to the shape illustrated in FIG. 4, but may have a shape illustrated in FIG. 5. FIG. 5 is a view schematically illustrating a micro lens shape according to another exemplary embodiment of the present invention and an organic light emitting diode display device including the same.

As shown in FIG. 5, the second insulating layer 260 includes a plurality of micro lenses which are disposed to be spaced apart from each other on a cross-section. In this case, the refractive index of the second insulating layer 260 including the plurality of micro lenses, which are disposed on the plane and spaced apart from each other, may be lower than the refractive index of the first electrode 210 and the refraction inducing layer 250 of the organic light emitting diode EL.

As illustrated in FIG. 5, the plurality of micro lenses are disposed to be spaced apart from each other on the cross-section, so that a process of forming the second insulating layer 260 including the plurality of micro lenses may be simplified.

Further, the plurality of micro lenses are disposed such that an upper portion and a side portion of each of the micro lenses is in contact with the first electrode 210 and a lower portion of each of the micro lenses is in contact with the refraction inducing layer 250. That is, each of the micro lenses is enclosed by the first electrode 210 and the refraction inducing layer 250, each of which have a higher refractive index than that of the micro lenses, so that the light generated from the organic light emitting diode EL may be further extracted to the outside of the substrate 110.

An optical property of an organic light emitting diode display device according to another exemplary embodiment of the present invention will be described in detail below.

Figure 6:
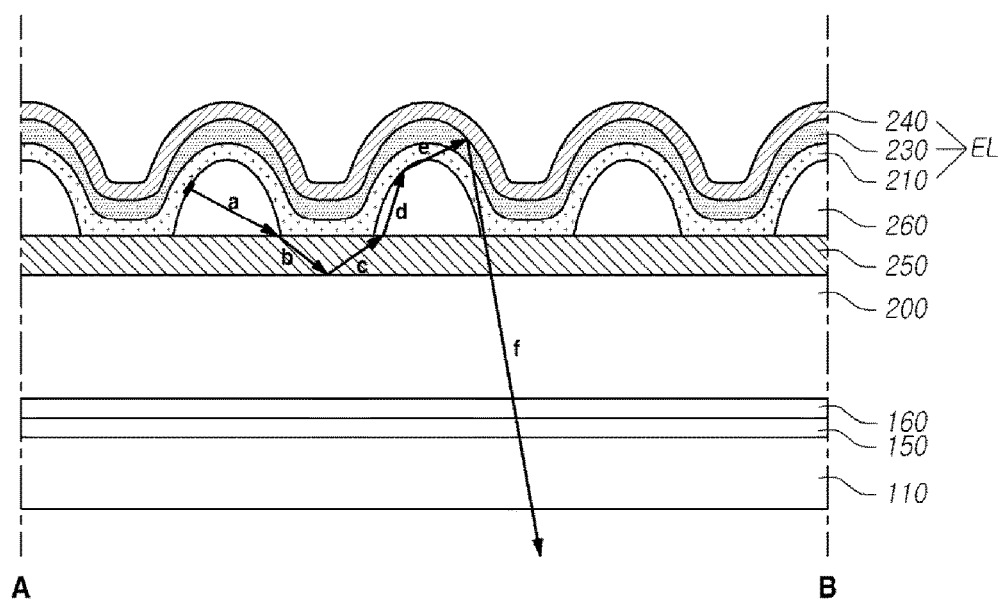
FIG. 6 is a schematic view illustrating a light path in an emission area of the organic light emitting diode display device according to an exemplary embodiment of the present invention.

FIG. 6 is a schematic view illustrating a light path in an emission area of the organic light emitting diode display device according to an exemplary embodiment of the present invention. Referring to FIG. 6, a first insulating layer 200, a refraction inducing layer 250, a second insulating layer 260 including a plurality of micro lenses, and an organic light emitting diode EL are disposed on a substrate 110.

A part of light generated from an organic light emitting layer 230 of the organic light emitting diode EL is reflected by a second electrode 240 of the organic light emitting diode EL so that a light path thereof is changed toward the first electrode 210 and a part of remaining light is emitted to the first electrode 210.

Here, a refractive index of the organic light emitting layer 230 may be substantially equal of a refractive index of the first electrode 210. Therefore, a light path of light generated in the organic light emitting layer 230 is not changed at an interface of the organic light emitting layer 230 and the first electrode 210.

Since the refractive index of the first electrode 210 is higher than a refractive index of the second insulating layer 260, light which passes through the first electrode and is incident at an angle larger than the critical angle for total reflection, may be totally reflected by the interface of the first electrode 210 and the second insulating layer 260. Further, light which is incident at the interface of the first electrode 210 and the second insulating layer 260 at an angle which is smaller than the critical angle for total reflection may be extracted toward the substrate 110.

In this case, since the refractive index of the second insulating layer 260 is lower than the refractive index of the refraction inducing layer 250, the light (a) which is totally reflected by the interface of the first electrode 210 and the second insulating layer 260 is refracted by the refraction inducing layer 250 to be incident thereon (b).

Further, since the refractive index of the refraction inducing layer 250 is higher than the refractive index of the first insulating layer 200, the light which is incident at an angle which is equal to or larger than the critical angle for total reflection may be totally reflected by the interface of the refraction inducing layer 250 and the first insulating layer 200.

The light (c) which is totally reflected by the interface of the refraction inducing layer 250 and the first insulating layer 200 reaches the interface of the refraction inducing layer 250 and the second insulating layer 260. In this case, the refractive index of the refraction inducing layer 250 is higher than the refractive index of the second insulating layer 260, and the light is refracted by the interface of the refraction inducing layer 250 and the second insulating layer 260 to be incident onto the second insulating layer 260.

The light (d) which is refracted toward the second insulating layer 260 reaches the interface of the second insulating layer 260 and the first electrode 210. Thereafter, the light which reaches the interface of the second insulating layer 260 and the first electrode 210 is refracted due to the difference of refractive indexes of the second insulating layer 260 and the first electrode 210 to travel to the second electrode 240 of the organic light emitting diode EL. The light (e) which reaches the second electrode 240 is reflected by the second electrode 240 to be extracted toward the substrate 110.

That is, even when light having an incident angle larger than the critical angle for total reflection is incident at the interface of the first electrode 210 and the second insulating layer 260, the number of times the light is incident on the micro lens structure of the second insulating layer 260 may increase due to the presence of the refraction inducing layer 250.

Specifically, when an incident angle of the light extracted through a micro lens of the second insulating layer 260 after passing through the refraction inducing layer 250 is larger than the critical angle of total reflection, the light is refracted multiple times by the refraction inducing layer 250 until the angle of the incident light extracted through the micro lens of the second insulating layer 260 becomes smaller than the critical angle of total reflection, at which point the light incident on the micro lens structure of the second insulating layer 260 is extracted to the outside of the substrate 110.

Further, the amount of light having an incident angle larger than a critical angle of total reflection at an interface of the first electrode 210 and the second insulating layer 260, which is locked in a diode, is reduced, thereby increasing light extraction efficiency and life span of the organic light emitting diode.

Further, the light which is extracted to the outside of the substrate 110 by the plurality of micro lenses of the second insulating layer 260 after passing through the refraction inducing layer 250 travels at an angle which is substantially vertical to a lower surface of the substrate 110. Therefore, the incident angle of the light which is extracted to the outside of the substrate 110 by the micro lens of the second insulating layer 260 after passing through the refraction inducing layer 250 is highly likely to be smaller than the critical angle of total reflection. Therefore, the amount of light locked in the substrate 110 may be reduced.

Figure 7:
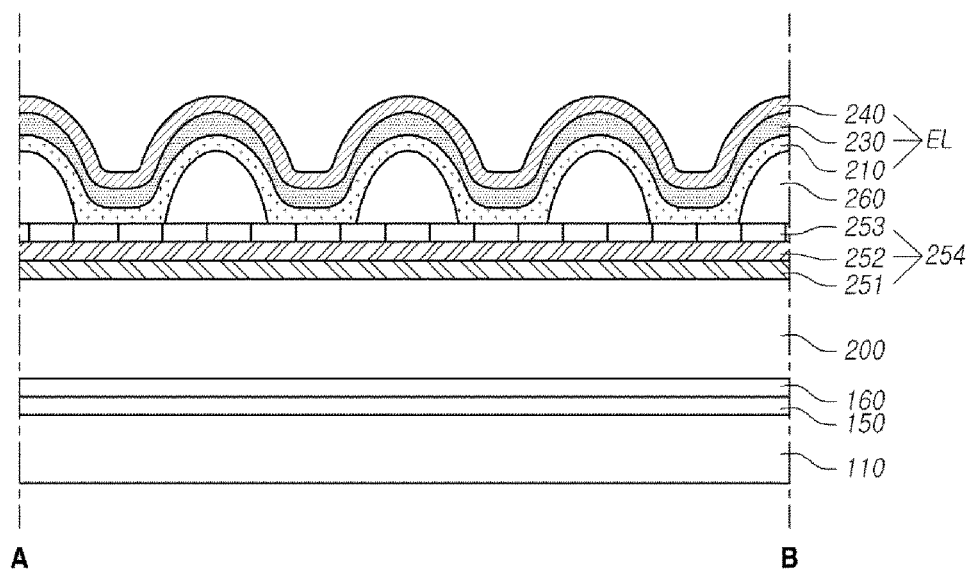
FIG. 7 is a schematic view illustrating a refraction inducing layer according to another exemplary embodiment of the present invention and an organic light emitting diode display device including the same.

Further, the exemplary embodiments of the present invention are not limited thereto, and may have a structure as illustrated in FIG. 7. FIG. 7 is a schematic view illustrating a refraction inducing layer according to another exemplary embodiment of the present invention and an organic light emitting diode display device including the same.

Referring to FIG. 7, a refraction inducing layer 254 according to another exemplary embodiment of the present invention may be configured by multi-layers. In FIG. 7, a configuration in which the refraction inducing layer 254 includes a three layered structure is disclosed. However, the exemplary embodiment of the present invention is not limited thereto, and a configuration including two or more layers may be allowed. However, in the following description, a configuration in which the refraction inducing layer 254 includes a three layered structure will be mainly described.

The refraction inducing layer 254 according to this exemplary embodiment is disposed between the first insulating layer 200 and the second insulating layer 260. The refractive index of the refraction inducing layer 254 may be higher than the refractive indexes of the first insulating layer 200 and the second insulating layer 260. The refraction inducing layer 254 according to another exemplary embodiment of the present invention is configured by a first refraction inducing layer 251 disposed on a first insulating layer 200, a second refraction inducing layer 252 disposed on the first refraction inducing layer 251, and a third refraction inducing layer 253 disposed on the second refraction inducing layer 252.

Here, a refractive index of the first refraction inducing layer 251 may be lower than a refractive index of the second refraction inducing layer 252. Further, the refractive index of the second refraction inducing layer 252 may be lower than a refractive index of the third refraction inducing layer 253. That is, in the refraction inducing layer 254 formed of a plurality of layers, the refractive index may be increased as the refraction inducing layer is closer to a first electrode 210 of the organic light emitting diode EL.

By doing this, even when light having an incident angle larger than the critical angle for total reflection is incident onto the interface of the first electrode 210 and the second insulating layer 260, the number of times the light is incident on the micro lens structure of the second insulating layer 260 may increase due to the presence of the refraction inducing layer 254.

Specifically, of the light which is incident at the interface of the second insulating layer 260 and the third refraction inducing layer 253, light which is incident at an angle equal to or larger than a critical angle for total reflection is not fully reflected toward the second insulating layer 260 but is directed toward the second refraction inducing layer 252. In this case, some of the light which is not fully reflected at the interface of the second insulating layer 260 and the third refraction inducing layer 253 is incident at the interface of the third refraction inducing layer 253 and the second refraction inducing layer 252 at an angle equal to or smaller than the critical angle for total reflection to be fully reflected. The fully reflected light may be incident on the micro lens of the second insulating layer 260. In the meantime, the light incident at the interface of the third refraction inducing layer 253 and the second refraction inducing layer 252 at an angle equal to or larger than the critical angle for total reflection is fully reflected at an interface of the second refraction inducing layer 252 and the first refraction inducing layer 251 to be incident on the micro lens.

As described above, the refraction inducing layer 254 is formed by multi-layers having different refraction indexes, so that a possibility of fully reflecting the light emitted from the organic light emitting diode by the refraction inducing layer 254 is increased. Therefore, the amount of light incident on the micro lens increases, so that the amount of light which may be extracted to the outside also increases.

Figure 8:
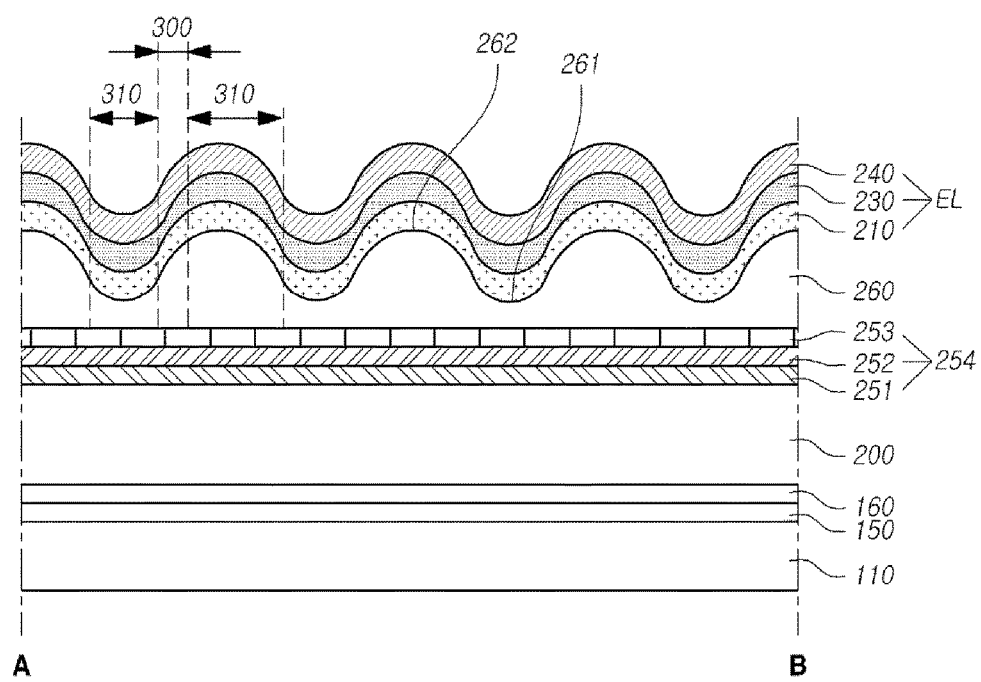
FIG. 8 is a view schematically illustrating a refraction inducing layer according to other exemplary embodiment of the present invention and an organic light emitting diode display device including the same.

Further, the exemplary embodiments of the present invention are not limited thereto, and may have a structure as illustrated in FIG. 8. FIG. 8 is a view schematically illustrating a refraction inducing layer according to other exemplary embodiment of the present invention and an organic light emitting diode display device including the same.

Referring to FIG. 8, a refraction inducing layer 254 according to another exemplary embodiment of the present invention may be configured by multi-layers.

The refraction inducing layer 254 according to the exemplary embodiment is disposed between the first insulating layer 200 and the second insulating layer 260. The refractive index of the refraction inducing layer 254 may be higher than the refractive indexes of the first insulating layer 200 and the second insulating layer 260.

Also, the shape of the micro lens can be the same as in FIG. 4.

As described above, the refraction inducing layer 254 is formed by multi-layers having different refraction indexes, so that a possibility of fully reflecting the light emitted from the organic light emitting diode by the refraction inducing layer 254 is increased.

Figure 9:
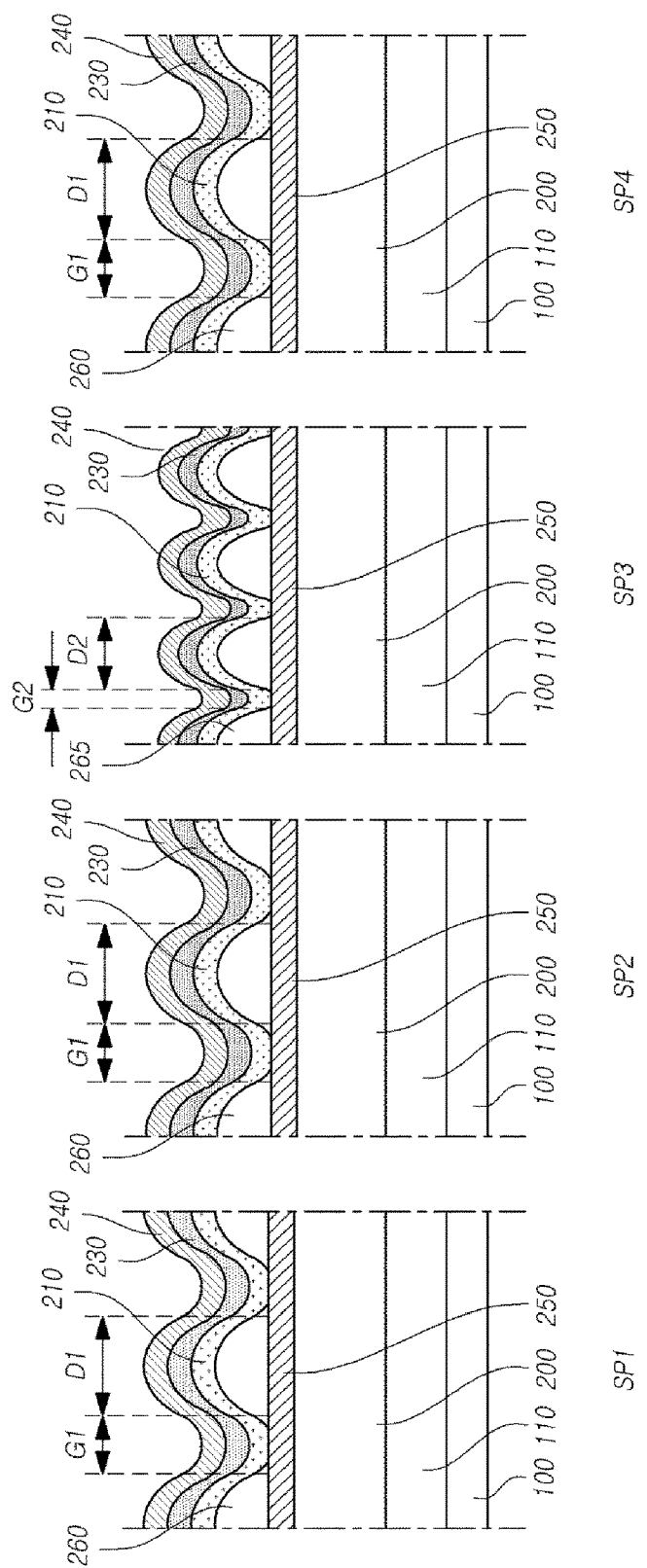
FIG. 9 is a schematic view illustrating an organic light emitting diode display device comprising sub-pixels according to another exemplary embodiment of the present invention.

In an organic light emitting diode display device including a refraction inducing layer according to another exemplary embodiment, the light path generated by the organic light emitting diode may be adjusted by varying the width of a micro lens disposed in each sub pixel and varying the distance between convex parts of adjacent micro lenses. This will be described with reference to FIG. 9. FIG. 9 is a schematic view illustrating an organic light emitting diode display device according to another exemplary embodiment of the present invention.

Referring to FIG. 9, in an organic light emitting diode display device, four sub pixels SP1, SP2, SP3, and SP4 form one pixel. The organic light emitting diode display device according to another exemplary embodiment of the present invention is not limited thereto, and three sub pixels may form one pixel. However, in the following description, a configuration in which four sub pixels form one pixel will be mainly described.

A first insulating layer 200 and a refraction inducing layer 250 are disposed on a substrate 110 on which sub pixels SP1, SP2, SP3, and SP4 are disposed. Here, a configuration in which the refraction inducing layer 250 having a single layer is disclosed, but the refraction inducing layer 250 may include a plurality of layers.

Second insulating layers 260 and 265 including a micro lens which is formed of a plurality of convex parts and a plurality of concave parts are disposed on the refraction inducing layer 250. In this case, the maximum width D2 of the convex part of the micro lens in at least one sub pixel among the four sub pixels SP1, SP2, SP3, and SP4 may be smaller than the maximum width D1 of the convex part of the micro lenses disposed in the remaining sub pixels.

Further, a maximum width G2 of the concave part of the micro lens in at least one sub pixel among the four sub pixels SP1, SP2, SP3, and SP4 may be smaller than a maximum width G1 of the concave part of the micro lenses disposed in the remaining sub pixels.

Here, an efficiency of the organic light emitting diode EL disposed on the micro lenses may vary depending on the maximum widths of the concave part and the convex part of the micro lenses.

For example, in the organic light emitting diode display device according to the exemplary embodiment of the present invention, a first sub pixel SP1, a second sub pixel SP2, a third sub pixel SP3, and a fourth sub pixel SP4 emit light having a first color, a second color, a third color, and a fourth color, respectively. In this case, when it is assumed that light emission efficiency of the organic light emitting diode EL, which emits light having the third color, is the lowest, the maximum width G1 of the concave part or the maximum width D1 of the convex part of the micro lens is reduced, to improve the efficiency.

Specifically, the light generated from the organic light emitting diode EL is partially extracted at an interface of the first electrode 210 and the second insulating layer 265 to the outside of the substrate 110 and is partially totally reflected by this interface to be refracted by the refraction inducing layer 250 to be incident onto the first insulating layer 200. Of the light which is incident onto the refraction inducing layer 250, light which is incident at an angle equal to or larger than the critical angle for total reflection may be totally reflected by the interface of the refraction inducing layer 250 and the first insulating layer 200.

The totally reflected light is refracted at the interface of the refraction inducing layer 250 and the second insulating layer 265 due to the difference of the refractive indexes of the refraction inducing layer 250 and the second insulating layer 265, and is incident onto the second insulating layer 265. Here, the light which reaches the second insulating layer 265 is refracted toward the second electrode 240 and the light which reaches the second electrode 240 is reflected to be extracted to the outside of the substrate 100.

In FIG. 9, the maximum width G2 of the concave part or the maximum width D2 of the convex part of the micro lens disposed in the third sub pixel is smaller than the maximum width G1 of the concave part or the maximum width G1 of the convex part of the micro lenses disposed in the other sub pixels. Therefore, the number of times the light is incident on the second insulating layer 265 via the refraction inducing layer 250 and the micro lens structure of the second insulating layer 265 may increase. Therefore, the light extraction efficiency in the sub pixel in which an organic light emitting diode EL having low efficiency is disposed may improve further.

As described above, the organic light emitting diode display device according to the exemplary embodiments of the present invention includes the first insulating layer 200 disposed on the substrate 110, the refraction inducing layer 250 disposed on the first insulating layer 200, a second insulating layer 260 which is disposed on the refraction inducing layer 250 and includes a plurality of micro lenses, and an organic light emitting diode EL disposed on the second insulating layer 260 or 265. Therefore, the light extraction efficiency increases and the efficiency of the organic light emitting diode EL may also improve. Further, there is no need to provide a specific low refractive index pattern disposed on the organic light emitting diode EL to increase the light extraction efficiency, which results in a suppression of the non-emission areas within the emission area.

Features, structures, and effects described in the above-described exemplary embodiments may be included in at least one exemplary embodiment of the present invention, but are not limited to only one exemplary embodiment. Further, features, structures, and effects exemplified in each exemplary embodiment may be embodied by being combined with another exemplary embodiment or modified by those skilled in the art. It should be interpreted that the combined and modified contents are included in the scope of the present invention.

In the above description, the present invention has been described based on the exemplary embodiments, but the exemplary embodiments are illustrative only, and do not limit the present invention. Those skilled in the art will appreciate that various modifications and applications, which are not exemplified in the above description, may be made without departing from the scope of the essential characteristics of the exemplary embodiments discussed herein. For example, each component described in detail in the embodiments can be modified.

What is claimed is:

1. An organic light emitting diode display device having an emission area and a non-emission area, comprising:
    a substrate including a plurality of sub pixels;
    a first insulating layer disposed on the substrate;
    a refraction inducing layer formed only of an inorganic material disposed on the first insulating layer;
    a second insulating layer disposed on the refraction inducing layer; and
    a first electrode, an organic light emitting layer, and a second electrode of an organic light emitting diode disposed on the second insulating layer,
    wherein the second insulating layer, the first electrode, the organic light emitting layer, and the second electrode include a plurality of micro lenses having a plurality of concave parts and a plurality of convex parts.

2. The organic light emitting diode display device according to claim 1, wherein a refractive index of the first electrode is higher than a refractive index of the second insulating layer.

3. The organic light emitting diode display device according to claim 1, wherein a refractive index of the second insulating layer is lower than a refractive index of the refraction inducing layer.

4. The organic light emitting diode display device according to claim 1, wherein a refractive index of the refractive inducing layer is higher than a refractive index of the first insulating layer.

5. The organic light emitting diode display device according to claim 1, wherein a refractive index of the first insulating layer is equal to a refractive index of the second insulating layer.

6. The organic light emitting diode display device according to claim 1, wherein a refractive index of the refraction inducing layer is equal to a refractive index of the first electrode.

7. The organic light emitting diode display device according to claim 1, wherein refractive indexes of the refraction inducing layer and the first electrode are 1.7 to 2.0.

8. The organic light emitting diode display device according to claim 1, wherein the refraction inducing layer and the first electrode are formed by the same material.

9. The organic light emitting diode display device according to claim 1, wherein the refraction inducing layer is any one of indium tin oxide (ITO), indium zinc oxide (IZO), and silicon nitride SiNx.

10. The organic light emitting diode display device according to claim 1, wherein the refraction inducing layer is formed of a plurality of layers having different refractive indexes.

11. The organic light emitting diode display device according to claim 10, wherein a refractive index of the refraction inducing layer, which is formed of a plurality of layers, increases as the layer is closer to the second insulating layer.

12. The organic light emitting diode display device according to claim 1, wherein in the plurality of sub pixels, a maximum width of a concave part or a convex part of a micro lens disposed in at least one sub pixel is smaller than a maximum width of a concave part or a convex part of a micro lens disposed in another sub pixel.

13. The organic light emitting diode display device according to claim 1, wherein in the plurality of sub pixels, a maximum width of a concave part or a convex part of at least one of the plurality of micro lenses disposed in a sub pixel having lower emission efficiency, is smaller than a maximum width of a concave part or a convex part of at least one of the plurality of micro lenses disposed in a sub pixel having higher emission efficiency.

14. The organic light emitting diode display device according to claim 1, wherein an upper portion and a side portion of each of the plurality of micro lenses is in contact with the first electrode, and
a lower portion of each of the plurality of micro lenses is in contact with the refraction inducing layer.

15. The organic light emitting diode display device according to claim 1, wherein the plurality of micro lenses are spaced apart from each other.

16. The organic light emitting diode display device according to claim 1, wherein the plurality of micro lenses is disposed to expose a part of the refraction inducing layer.

17. The organic light emitting diode display device according to claim 1, wherein when an incident angle of light incident on the second insulating layer is larger than a critical angle of total reflection, and
the light is incident on the second insulating layer at least once after an initial incidence via the refraction inducing layer.

18. The organic light emitting diode display device according to claim 1, wherein the refraction inducing layer is disposed on an emission area.

19. The organic light emitting diode display device according to claim 1, wherein a bank pattern is disposed on the first insulating layer.

20. An organic light emitting diode display device, comprising:
a substrate including a plurality of sub pixels;
a first insulating layer disposed on the substrate;
a refraction inducing layer formed only of an inorganic material disposed on the first insulating layer;
a second insulating layer disposed on the refraction inducing layer; and
a first electrode, an organic light emitting layer, and a second electrode of an organic light emitting diode disposed on the second insulating layer,
wherein the organic light emitting diode comprises a plurality of concave parts and a plurality of convex parts, and
wherein a refractive index of the first insulating layer is equal to a refractive index of the second insulating layer, and a refractive index of the refraction inducing layer is equal to a refractive index of the first electrode.

21. The organic light emitting diode display device according to claim 20, wherein the refractive index of the refraction inducing layer and the first electrode is higher than the refractive index of the first insulating layer and the second insulating layer.

* * * * *